US012652832B2

(12) United States Patent
Leobandung

(10) Patent No.: US 12,652,832 B2
(45) Date of Patent: Jun. 9, 2026

(54) REDUCED N-WELL AND P-WELL SPACING

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 534 days.

(21) Appl. No.: 17/805,804

(22) Filed: Jun. 7, 2022

(65) Prior Publication Data
US 2023/0395653 A1     Dec. 7, 2023

(51) Int. Cl.
| | |
|---|---|
| *H10D 62/10* | (2025.01) |
| *H10W 10/00* | (2026.01) |
| *H10W 10/17* | (2026.01) |

(52) U.S. Cl.
CPC ........ *H10D 62/115* (2025.01); *H10W 10/014* (2026.01); *H10W 10/17* (2026.01)

(58) Field of Classification Search
CPC ............ H10D 62/115; H10D 84/0188; H10D 84/0191; H10D 84/038; H10D 84/85; H01L 21/76224; H01L 21/76237
See application file for complete search history.

(56) References Cited

U.S. PATENT DOCUMENTS

| | | | | |
|---|---|---|---|---|
| 6,825,086 | B2 | 11/2004 | Lee | |
| 7,045,410 | B2 * | 5/2006 | Mehrad ............. | H01L 21/76237 438/223 |
| 7,078,324 | B2 * | 7/2006 | Dudek .............. | H01L 21/76232 257/E21.549 |
| 7,205,617 | B2 * | 4/2007 | Ohta .................... | H10D 62/115 257/E27.06 |
| 7,361,955 | B2 | 4/2008 | Kao | |
| 7,834,414 | B2 | 11/2010 | Suzuki | |
| 9,362,310 | B2 | 6/2016 | Adam | |
| 2004/0142537 | A1 * | 7/2004 | Lee .................... | H10D 84/0188 257/E21.546 |
| 2004/0219769 | A1 * | 11/2004 | Voldman ........... | H01L 21/26586 257/E21.345 |
| 2005/0095804 | A1 * | 5/2005 | Dietz ................. | H10D 30/0221 257/E29.054 |
| 2007/0059897 | A1 * | 3/2007 | Tilke ................... | H01L 21/3065 257/E21.235 |
| 2007/0170517 | A1 * | 7/2007 | Furukawa ............ | H10D 84/038 257/E21.551 |

(Continued)

FOREIGN PATENT DOCUMENTS

| | | | | | |
|---|---|---|---|---|---|
| CN | 101521229 | B | * | 3/2013 | ........... H10D 62/107 |
| EP | 1517365 | A2 | * | 3/2005 | ....... H01L 21/76232 |

(Continued)

*Primary Examiner* — Mohammed Shamsuzzaman

(74) *Attorney, Agent, or Firm* — Gavin Giraud

(57)     ABSTRACT

Embodiments disclosed herein describe semiconductor devices that include a semiconductor device includes a shallow trench isolation (STI) oxide and an N-well region with a N-well implant dopant. The N-well region may contact a first side of the STI oxide. The semiconductor structure also includes a P-well region with a P-well implant dopant. The P-well region may contact a second side of the STI oxide.

9 Claims, 5 Drawing Sheets

<u>100</u>

(56) References Cited

U.S. PATENT DOCUMENTS

| 2007/0170518 | A1* | 7/2007 | Furukawa | H01L 21/76229 |
| | | | | 257/E21.339 |
| 2007/0215953 | A1* | 9/2007 | Voldman | H10D 84/0109 |
| | | | | 257/E21.696 |
| 2022/0052044 | A1 | 2/2022 | More | |
| 2023/0095534 | A1* | 3/2023 | Nandakumar | H10D 62/371 |
| | | | | 257/402 |
| 2023/0369134 | A1* | 11/2023 | Tai | H10D 84/0151 |

FOREIGN PATENT DOCUMENTS

| EP | 1763074 | A2 | * | 3/2007 | H01L 21/3086 |
| EP | 3945553 | A1 | * | 2/2022 | H10D 84/0151 |
| WO | WO-2006103634 | A2 | * | 10/2006 | H10D 62/127 |

* cited by examiner

100

100

100

100

100

100

REDUCED N-WELL AND P-WELL SPACING

BACKGROUND

The present invention relates generally to the field of well fabrication methods and resulting structures for semiconductor devices, and more particularly to using a dummy material to reduce implant dopant straggle, and replacing the dummy material with oxide.

In fabricating semiconductor devices, millions of devices can be located together on a single substrate. Useful control of these millions of devices relies on the application of electrical signals to specific devices while insulting the electrical signals from shorting to anything else (e.g., other devices). Complementary metal-oxide silicon (CMOS) fabrication technology is one useful way to fabricate transistor devices on an integrated circuit (IC) wafer. CMOS provides an inherently low power static circuit technology that has the capability of providing lower power-delay product than other technologies. Scaling CMOS ICs down in size may include scaling NFET to PFET spacing, gate pitch, and metal pitch, among other things.

In this process of forming the NFETs and PFETs of the CMOS, a doped well may be formed by masking and diffusion. For NFET devices, a deep p-well is diffused into the substrate, and for PFET devices, a deep n-well is diffused into the substrate. Spacing of the NFET and PFET devices can thus depend on spacing of the n-well and p-well.

SUMMARY

According to one embodiment of the present invention, a semiconductor device includes a shallow trench isolation (STI) oxide and an N-well region with a N-well implant dopant. The N-well region may contact a first side of the STI oxide. The semiconductor structure also includes a P-well region with a P-well implant dopant. The P-well region may contact a second side of the STI oxide.

According to one embodiment of the present invention, a method of forming a semiconductor structure includes filling a shallow trench isolation (STI) trench with dummy material, implanting a first implant dopant into a first well directly adjacent to the STI trench, removing the dummy material, and filling the STI trench with STI oxide.

According to one embodiment of the present invention, a semiconductor structure may include a shallow trench isolation (STI) region having an STI oxide, and a first well with a first implant dopant. The first implant dopant does not extend through the STI oxide.

DETAILED DESCRIPTION

Figure 1:
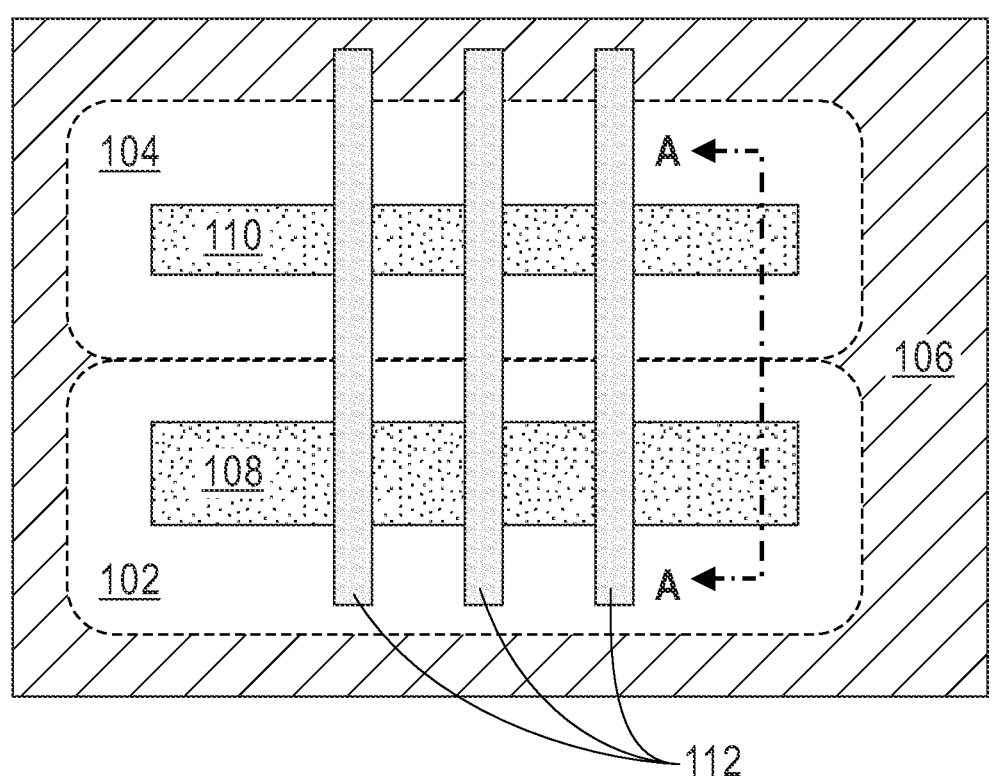
FIG. 1 is a schematic top view depicting a semiconductor structure, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface. Typically, the major surface is along a plane of a monocrystalline silicon layer on which transistor devices are fabricated.

For integrated circuits (ICs), the formation of wells (i.e., n-wells and p-wells) is limited mostly by straggle and not by limitations in the lithographic processes used to mask the well locations. That is, to form the wells in the IC, an implantation process creates ions (charged atoms or molecules) via an electric field stripping electrons from an element stream. The implantation process then filters and accelerates the ions toward a target wafer, where the ions are buried in a substrate. The depth of the implantation depends on the acceleration energy (voltage). The dose is very carefully controlled by integrating the measured ion current. This integration process tends to minimize noise in the measurement of the ion current, resulting in high accuracy in the depth and the dose of the ions in the substrate.

Lateral implantation is harder to account for using control of the acceleration energy. During implantation, the substrate scatters the ions at random angles. This "straggle" can be predicted with accuracy, but typically cannot be controlled. Therefore, the disclosed embodiments propose a method and structure to reduce lateral implant straggle by incorporating a dummy material into the process of forming the shallow trench isolation (STI). The dummy material may include a heavy material (i.e., a material that has a higher atomic weight than silicon oxide) that is later replaced with the usual silicon oxide. The dummy material slows down implant energy so that the ions do not pass through the dummy material, and since the dummy material is replaced, the final STI oxide will include none of the implantation dopants.

Referring now to the figures, FIG. 1 is a schematic top view depicting a semiconductor structure 100, in accordance with one embodiment of the present invention. The semiconductor structure 100 includes a first well 102 and a second well 104. The first well 102 and the second well 104 are typically oppositely doped areas of a substrate 106. For example, the first well 102 may be a n-well, while the second well 104 may be a p-well. Certain embodiments may have the first well 102 fabricated as a p-well, the description in this application related to type or strength of the wells 102, 104 is not limiting.

The semiconductor structure 100 also includes a first active area 108 in the first well 102, and a second active area 110 in the second well 104. The first active area 108 may include a PFET, while the second active area 110 may include an NFET (or vice versa). The semiconductor structure 100 may also include gates 112 that cross the active areas 108, 110. The gates 112 cross the active areas 108, 110 between source/drains (S/Ds) to control signal flow along the active areas 108, 110. As mentioned above, spacing between the first active area 108 and the second active area 110 depends on the spacing and accuracy of the spacing between the first well 102 and the second well 104. The process for improving the spacing between the first well 102 and the second well 104 using a dummy material is explained in further detail using the figures below.

Figure 2:
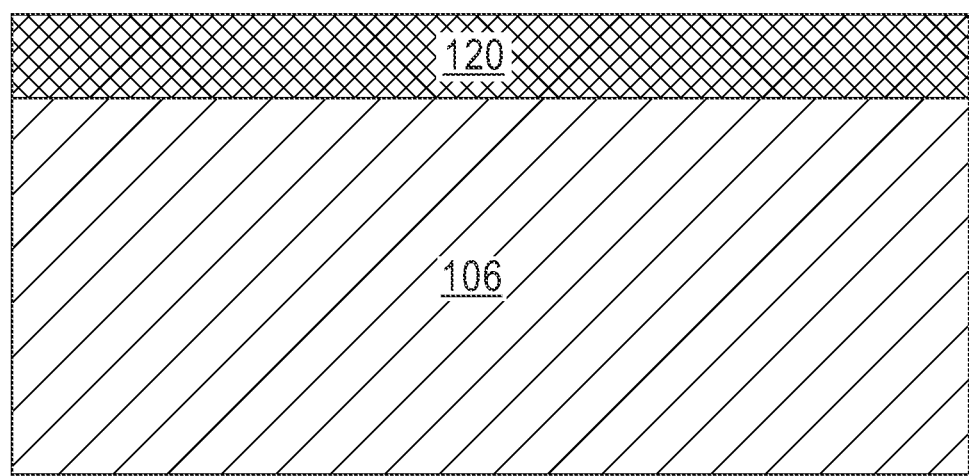
FIG. 2 is a schematic cross-sectional side view depicting the semiconductor structure of FIG. 1 at a fabrication stage, in accordance with one embodiment of the present invention.

FIG. 2 is a schematic cross-sectional side view depicting the semiconductor structure 100 of FIG. 1, in accordance with one embodiment of the present invention. The semiconductor structure 100 is depicted in an early fabrication stage along line A-A' of FIG. 1, and does not include the wells 102, 104, active areas 108, 110, or gates 112. The substrate 106 may include silicon or silicon compounds. In certain embodiments, the substrate 106 may include uniformly doped dopants. For example, the substrate 106 may be processed to include a wafer sized layer of doping. The substrate 106 may be formed by ion implantation and thermal anneal. The substrate 106 may include a crystalline material, for example, mono-crystalline (single crystal) silicon. The substrate 106 may be very lightly doped (less than 1e15 atoms/cm3) or nominally un-doped (less than 1e14 atoms/cm3). The substrate 106 may alternatively be formed by epitaxially deposited doped or undoped silicon layers, or by a combination of epitaxy and implantation, or by layer transfer annealing of implants and doping. These techniques may include, for example, conductive/inductive thermal, optical annealing techniques or types of Rapid Thermal Anneal (RTA or spike). The illustrated substrate 106 is undoped to eventually create a metal-oxide semiconductor field-effect transistor (MOSFET).

The semiconductor structure 100 includes a hard mask 120 formed on the top of the substrate 106. The hard mask 120 may include several materials, such as, for example, silicon oxide and silicon nitride layers, or silicon oxide and amorphous carbon layers. The hard mask 120 may be used with lithographic processes to block portions of the substrate 106 so subsequent processes may be applied or blocked to those portions of the substrate 106.

Figure 3:
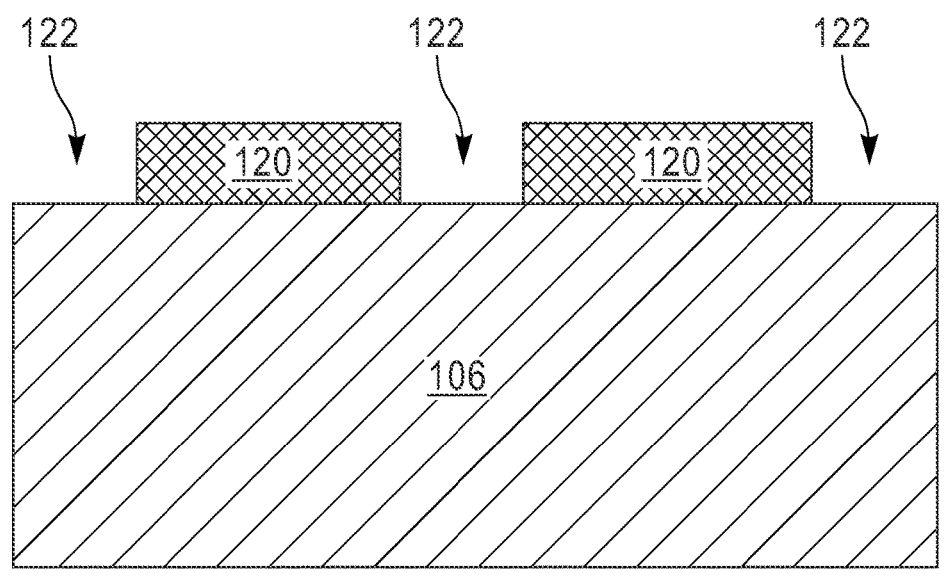
FIG. 3 is a schematic cross-sectional side view depicting the semiconductor structure of FIG. 1 at a fabrication stage, in accordance with one embodiment of the present invention.

FIG. 3 is a schematic cross-sectional side view depicting the semiconductor structure 100 of FIG. 1 at a fabrication stage, in accordance with one embodiment of the present invention. The semiconductor structure 100 includes holes 122 that have been etched into the hard mask 120. The holes 122 may be formed using a photo resist and a lithographic application of a pattern that weakens or strengthens the hard mask 120 against a subsequent etch process that removes the hard mask 120 from the holes 122 portion.

Figure 4:
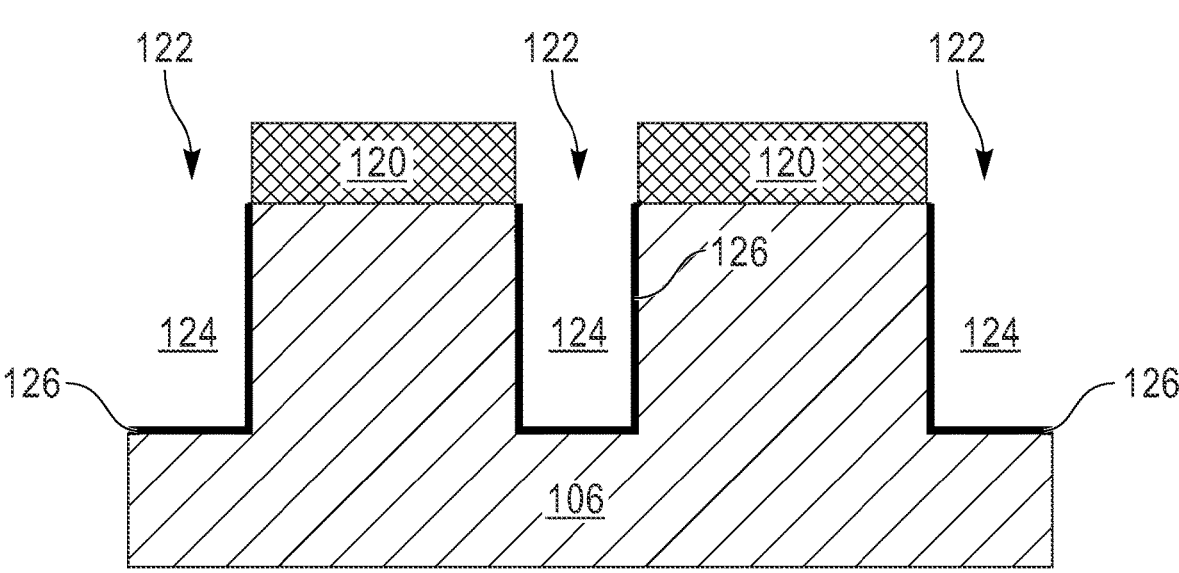
FIG. 4 is a schematic cross-sectional side view depicting the semiconductor structure of FIG. 1 at a fabrication stage, in accordance with one embodiment of the present invention.

FIG. 4 is a schematic cross-sectional side view depicting the semiconductor structure 100 of FIG. 1 at a fabrication stage, in accordance with one embodiment of the present invention. The semiconductor structure 100 includes shallow trench isolation (STI) trenches 124 that are formed under the holes 122 in the hard mask 120. The STI trenches 124 may be formed by a directional etch process that etches the substrate 106 without significant affect on the hard mask 120. Directional etch may include, but is not limited to, reactive ion etch (RIE).

The semiconductor structure 100 may also include thin insulator 126, such as oxide or nitride or multiple layer of oxide and nitride, formed within the STI trenches 124. The thin insulator 126 protects the substrate 106 and provide good interface free of interface trap charge, and contains the depositions within the STI trenches 124. The thin insulator 126 may be applied using a conformal deposition technique, or grown by oxidizing the trench surface so that an even application is completed along the sides of the STI trenches 124.

Figure 5:
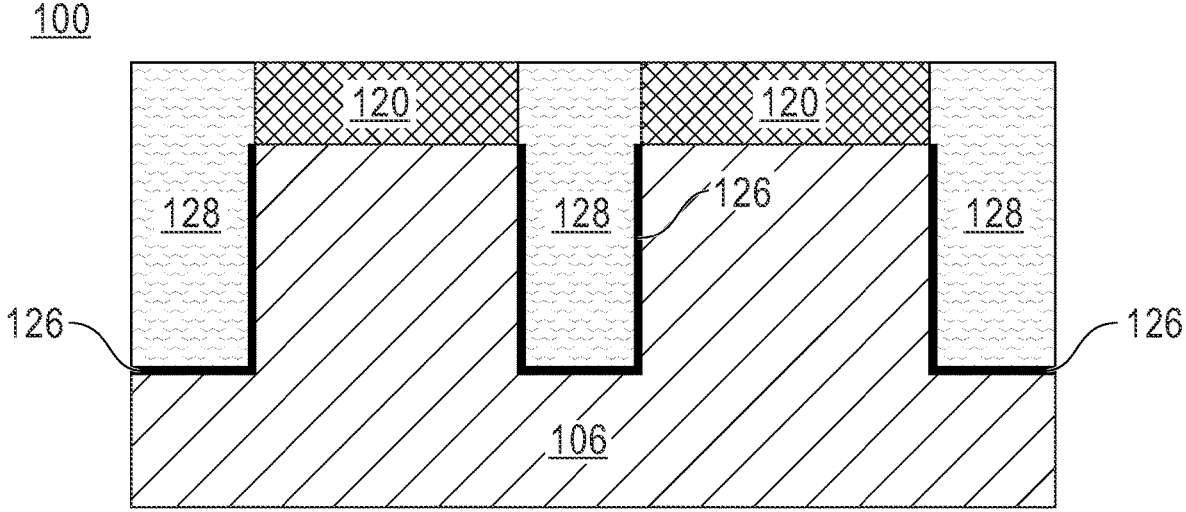
FIG. 5 is a schematic cross-sectional side view depicting the semiconductor structure of FIG. 1 at a fabrication stage, in accordance with one embodiment of the present invention.

FIG. 5 is a schematic cross-sectional side view depicting the semiconductor structure 100 of FIG. 1 at a fabrication stage, in accordance with one embodiment of the present invention. The semiconductor structure 100 includes dummy material 128 formed in the STI trenches 124. The dummy material 128 may include a "heavy" material that slows down the implantation of ions into the substrate 106. Heavy, as used herein for the dummy material 128, means that the atomic weight of the matter is heavier than silicon oxide. The dummy material 128 may utilize heavy material because the slowing, blocking, or otherwise restricting the implantation of ions is directly related to the atomic weight of the matter. Materials that specifically may be used as the dummy material 128 may include Germanium, Antimony, and Tungsten.

Figure 6:
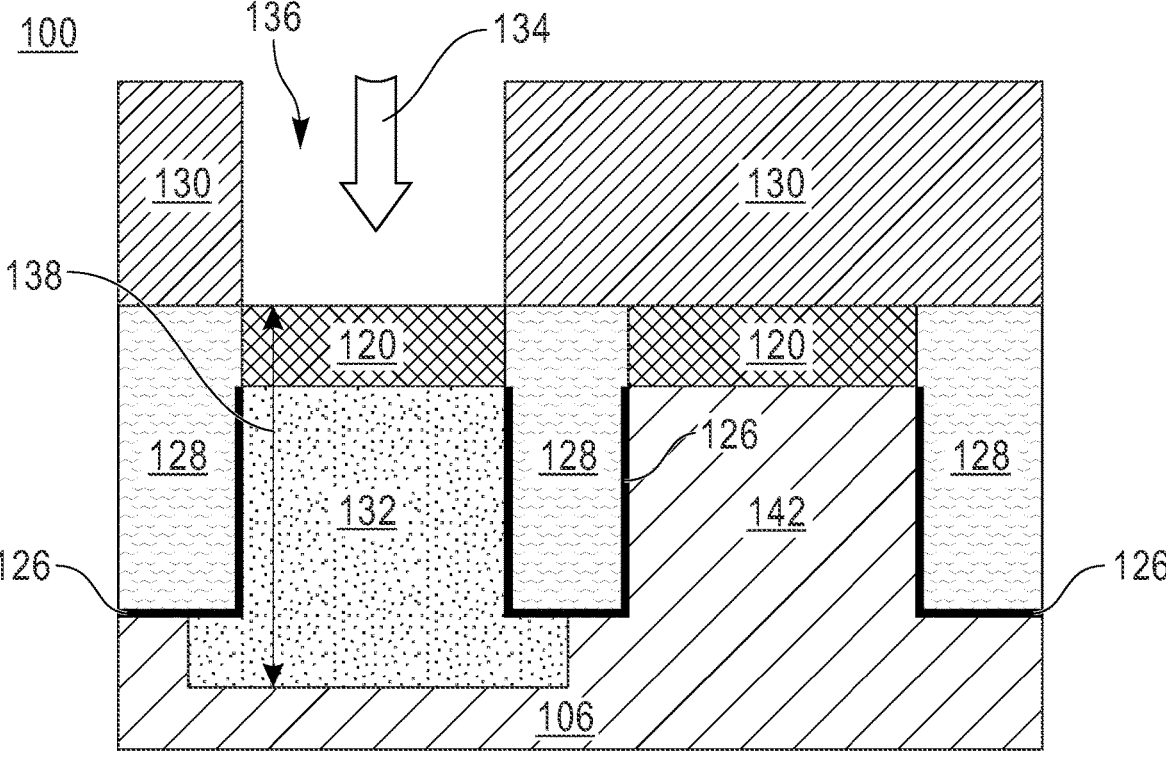
FIG. 6 is a schematic cross-sectional side view depicting the semiconductor structure of FIG. 1 at a fabrication stage, in accordance with one embodiment of the present invention.

FIG. 6 is a schematic cross-sectional side view depicting the semiconductor structure 100 of FIG. 1 at a fabrication stage, in accordance with one embodiment of the present invention. The semiconductor structure 100 includes a first resist pattern 130 and a first well 132. The first well 132 is created when a first type of ion 134 is implanted into the substrate 106. The first resist pattern 130 blocks the first ions 134 from being implanted, and an implant hole 136 may be patterned into the first resist pattern 130 to allow the first ions 134 to implant in the first well 132. The implant hole 136 may be formed using lithographic techniques described above.

Implantation of the first ions 134 works by accelerating the first ions 134 into the substrate 106, where the first ions 134 penetrate up to a penetration distance 138 depending on the energy that is used to accelerate the first ions 134. The first ions 134 are also scattered laterally (i.e., parallel to the top surface of the substrate 106) when the first ions 134 contact the atoms in the substrate 106. The dummy material 128 within the STI trenches 124 receives the first ions 134 and prevents the first ions 134 from scattering into a second well 142. The first ions 134 are therefore contained within the first well 132, the first resist pattern 130, and the dummy material 128.

Figure 7:
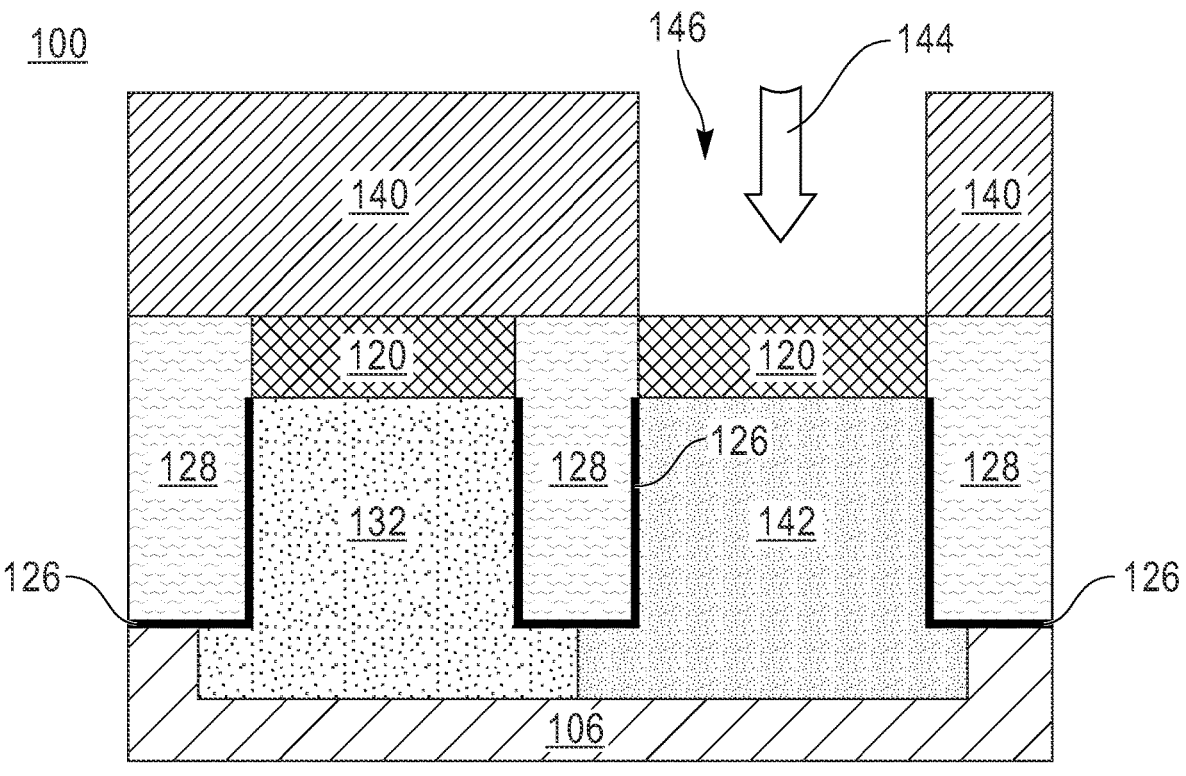
FIG. 7 is a schematic cross-sectional side view depicting the semiconductor structure of FIG. 1 at a fabrication stage, in accordance with one embodiment of the present invention.

FIG. 7 is a schematic cross-sectional side view depicting the semiconductor structure 100 of FIG. 1 at a fabrication stage, in accordance with one embodiment of the present invention. The semiconductor structure 100 includes a second resist 140 pattern, with the second well 142 implanted with a second ion 144. As with the first resist pattern 130, the second resist 140 includes a second implant hole 146 where the second ions 144 have implantation access to the second well 142. As with the first ions 134, the dummy material 128 blocks the second ions 144 from scattering into the first well 132. The dummy material 128 may thus possibly have first ions 134 and second ions 144 implanted, but the dummy material 128 blocks the first ions 134 from the second well 142 and the second ions 144 from the first well 132.

The first ions 134 may include a N-well ion such as Phosphorus implanted into the first well 132, while the second ions 144 may include a P-well ion such as Boron implanted into the second well 142. The N-well ion does not have to be implanted first, and certain embodiments may include the P-well ion implanted before the N-well ion.

Figure 8:
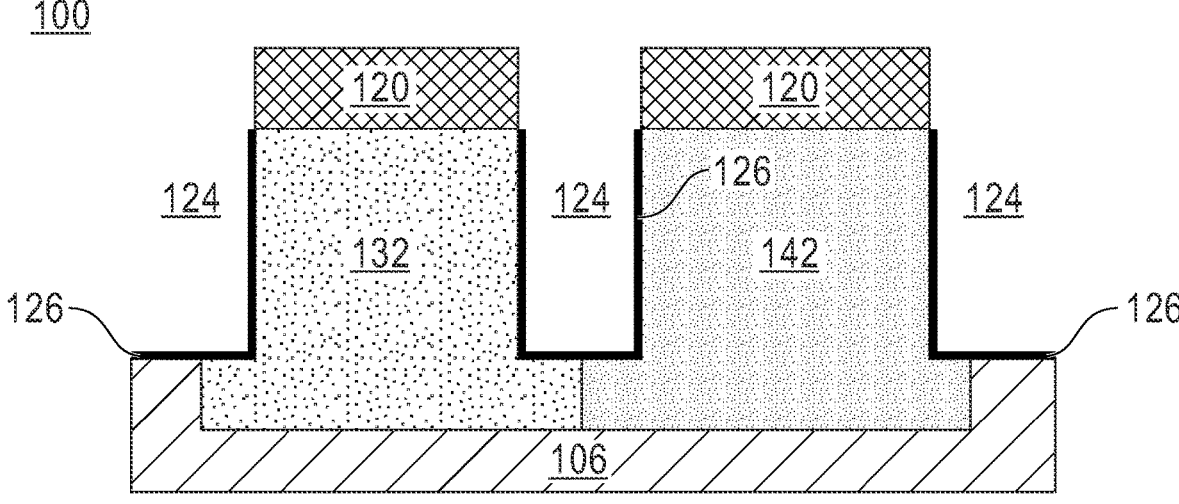
FIG. 8 is a schematic cross-sectional side view depicting the semiconductor structure of FIG. 1 at a fabrication stage, in accordance with one embodiment of the present invention.

FIG. 8 is a schematic cross-sectional side view depicting the semiconductor structure 100 of FIG. 1 at a fabrication stage, in accordance with one embodiment of the present invention. The semiconductor structure 100 no longer includes the second resist 140 and the dummy material 128, which have been removed from the substrate 106 using selective etch processes that do not affect the substrate 106, the first well 132, the second well 142, the thin oxide 126, or the hard mask 120. The first well 132 and the second well 142 keep the implanted ions (i.e., the N-well or P-well ions, respectively) even after the dummy material 128 is removed. The ions that were scattered into the dummy material 128, on the other hand, are removed with the dummy material 128. The STI trenches 124 are empty again, and contain no ions, neither the first ions 134 nor the second ions 144.

Figure 9:
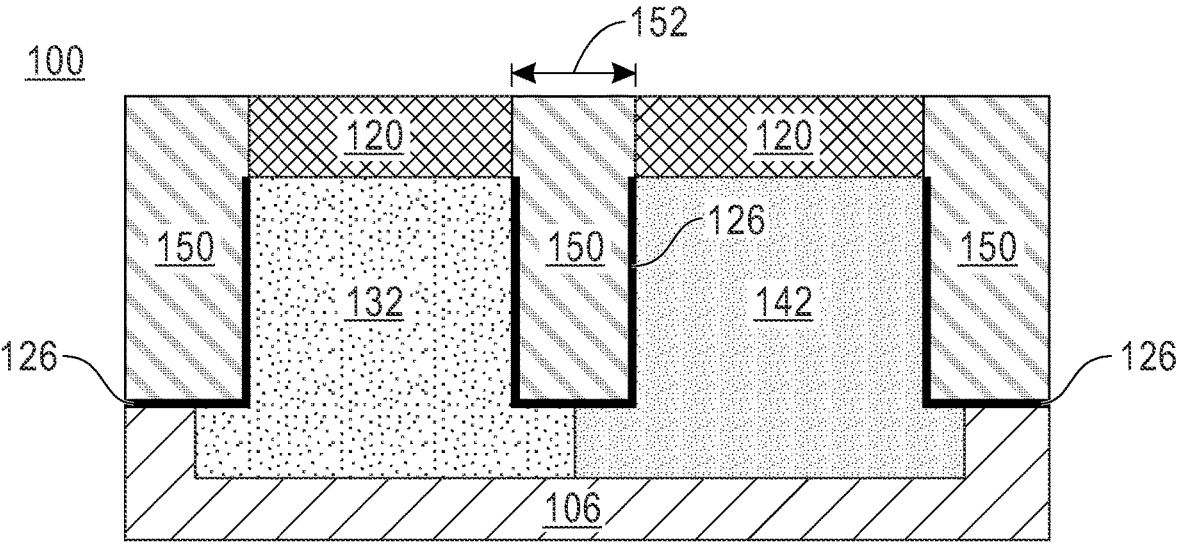
FIG. 9 is a schematic cross-sectional side view depicting the semiconductor structure of FIG. 1 at a fabrication stage, in accordance with one embodiment of the present invention.

FIG. 9 is a schematic cross-sectional side view depicting the semiconductor structure 100 of FIG. 1 at a fabrication stage, in accordance with one embodiment of the present invention. The semiconductor structure 100 includes an STI oxide 150 deposited in the STI trenches 124. The STI oxide may be deposited using known techniques such as, but not limited to, atomic layer deposition (ALD) and chemical vapor deposition (CVD). The STI oxide 150 may be polished and/or planarized after deposition. The STI oxide 150 is deposited free from ions, including the first ions 134 and the second ions 144. The deposition of the STI oxide 150 after the implantation of the first ions 134 and the second ions 144 means that the first well 132 can be closer to the second well 142 without contamination of the first well 132 with the second ions 144; and without contamination of the second well 142 with the first ions 134. The STI oxide 150 therefore has a width 152 between the first well 132 and the second well 142 that is less than a straggle distance for the first ion 134 and less than a straggle distance for the second ion 144. In certain embodiments, the width 152 may be measured as less than 0.03 microns.

Figure 10:
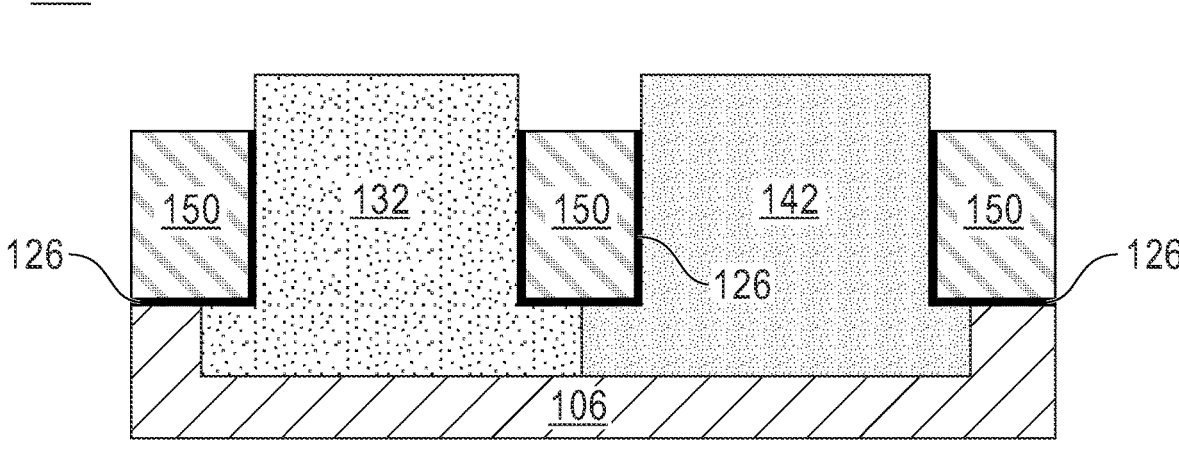
FIG. 10 is a schematic cross-sectional side view depicting the semiconductor structure of FIG. 1 at a fabrication stage, in accordance with one embodiment of the present invention.

FIG. 10 is a schematic cross-sectional side view depicting the semiconductor structure 100 of FIG. 1 at a fabrication stage, in accordance with one embodiment of the present invention. The semiconductor structure 100 has the hard mask 120 removed, and the STI oxide 150 recessed from below a top of the first well 132 and the second well 142 such that the first well 132 and the second well 142 protrude above the top surface of the STI oxide 150. The recession of the STI oxide 150 makes room for other components. Such as for FINFETs, that may depend on the subsequent fabrication processes such as the creation of the active areas 108, 110.

The integrated circuit chips resulting from the processes described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a shallow trench isolation (STI) oxide formed in a trench from etching a dummy material;

an N-well region comprising a N-well implant dopant, wherein the N-well region contacts a first side of the STI oxide; and a P-well region comprising a P-well implant dopant, wherein the P-well region contacts a second side of the STI oxide, wherein the STI oxide comprises a width between the N-well region and P-well region that is less than a straggle distance for the N-well implant dopant into the STI oxide and less than a straggle distance for the P-well implant dopant into the STI oxide;

wherein the width between the N-well region and P-well region that is less than 0.03 microns.

2. The semiconductor structure of claim 1, wherein the P-well implant dopant comprises Phosphorus and the N-well implant dopant comprises Boron.

3. The semiconductor structure of claim 1, wherein the STI oxide comprises silicon oxide with none of the N-well implant dopant and with none of the P-well implant dopant.

4. The semiconductor structure of claim 1, comprising a thin oxide lining the STI oxide.

5. The semiconductor structure of claim 1, wherein the N-well region and the P-well region protrude above a top surface of the STI oxide.

6. A semiconductor structure, comprising:
a shallow trench isolation (STI) region comprising an STI oxide formed in a trench from etching a dummy material;

a first well comprising a first implant dopant, wherein the first implant dopant does not extend through the STI oxide, wherein the STI oxide comprises a width that is less than a straggle distance for the first implant dopant through the STI oxide;

a second well comprising a second implant dopant, wherein the second implant dopant does not extend through the STI oxide; and wherein the width between the first well and the second well that is less than 0.03 microns.

7. The semiconductor structure of claim 6, wherein the width is between the first well and the second well and is less than a straggle distance for the second implant dopant.

8. The semiconductor structure of claim 6, wherein the first implant dopant comprises a selection from the group consisting of: Phosphorus and Boron.

9. The semiconductor structure of claim 6, comprising a thin oxide lining the STI oxide.

* * * * *